United States Patent

Tsukamoto et al.

[11] Patent Number: 6,154,040
[45] Date of Patent: Nov. 28, 2000

[54] APPARATUS FOR TESTING AN ELECTRONIC DEVICE

[75] Inventors: Teruaki Tsukamoto, Tokyo; Minoru Doi, Tokorozawa, both of Japan

[73] Assignees: NEC Corporation, Tokyo, Japan; Agilent Technologies, Palo Alto, Calif.

[21] Appl. No.: 09/184,253

[22] Filed: Nov. 2, 1998

[30] Foreign Application Priority Data

Oct. 31, 1997 [JP] Japan .................................. 9-315876

[51] Int. Cl.[7] .................................................. G01R 31/02
[52] U.S. Cl. ...................... 324/755; 324/158.1; 324/754; 361/785; 439/331; 439/71
[58] Field of Search .................................. 324/754, 755, 324/158.1, 756; 361/785; 439/331, 71

[56] References Cited

U.S. PATENT DOCUMENTS 3,678,385  7/1972  Bruner .................................. 324/158.1
5,177,436  1/1993  Lee ....................................... 324/158.1
5,493,237  2/1996  Volz et al. ............................... 324/754
5,749,738  5/1998  Johnson et al. ............................ 439/66

*Primary Examiner*—Safet Metjahic
*Assistant Examiner*—Jimmy Nguyen
*Attorney, Agent, or Firm*—Sughrue, Mion, Zinn, Macpeak & Seas, PLLC

[57] ABSTRACT

In an apparatus for testing an electronic device, a life of a measurement board is significantly extended by interposing a plate member between the measurement board and a device mounting member for accommodating the electronic device. The plate member has a plurality of rear pads to be brought into contact with each of the pads of the measurement board on a back surface thereof and a plurality of front pads electrically connected to each of the rear pads through via holes on a front surface thereof. The plate member is places between the measurement board and the device mounting member on testing the electronic device and can be readily replaced by a new one when it is worn away.

12 Claims, 8 Drawing Sheets

APPARATUS FOR TESTING AN ELECTRONIC DEVICE

BACKGROUND OF THE INVENTION

The invention generally relates to an apparatus for testing an electronic device, more particularly to the apparatus for performing the test at a lower cost.

Conventionally, an apparatus of the type described is used to test an electronic device, such as an IC device, which has a great number of electrodes or electric leads on a surface. To this end, the apparatus has a main body, a measurement board on the main body, and a mounting member or socket for mounting or accommodating the electronic device. The measurement board has a plurality of pads or terminals laid on its surface. The mounting member is mounted on the measurement board to accommodate the electronic device on testing the same and serves to electrically connect the electrodes or electric leads of the electronic device to the pads of the measurement board.

To this end, a plurality of contact chips are arranged within a bottom surface of the mounting member so that they are partially projected from the bottom surface towards the electronic device and the measurement board.

With this structure, each electrodes on the electronic device can be mechanically contacted with a corresponding pad of the measurement board through each contact chip when the electronic device is mounted or accommodated within the mounting member. In this situation, it is possible to test the electric leads of the electronic device by the use of the apparatus.

However, the respective pads of the measurement board should be brought into contact with the contact chips and wiped with the pads.

Herein, it is to be noted that the pads of the measurement board are repeatedly contacted or wiped with the contact chips a great number of times because a great deal of electronic devices must be tested by the apparatus. Under the circumstances, it is readily understood that each pad of the measurement board is gradually scraped and worn away finally. This shows that the measurement board should be replaced or exchanged by a new one. However, the measurement board is very expensive because a complex electronic circuitry is integrated thereon.

SUMMARY OF THE INVENTION

It is an object of the invention is to provide an apparatus for testing an electronic device which can significantly lengthen a life of a measurement board by substituting the other member for a degradation of the measurement board.

In accordance with the invention, there is provided an apparatus for testing an electronic device, for mounting thereon the electronic device under test and for performing an electronic test on the electronic device under test. The apparatus comprises a measurement board forming a part of a main body of the testing apparatus and having a plurality of pads on a surface thereof and a plate member having a rear surface and a front surface. The plate member is replaceably configured and mounted on the measurement board. The plate member has a plurality of rear pads coupled to the pads on the measurement board and provided on the rear surface and a plurality of front pads coupled to corresponding ones of the rear pads through via holes are provided. The apparatus further comprises a device mounting member having an upper surface, a bottom surface, and contact elements extending from the upper surface to the bottom surface. The contact elements are partially protruded outwardly from the upper and the bottom surfaces of the device mounting member. The protruding parts from the bottom surface wipe the front pads on the plate member and the protruding parts from the upper surface wipe the terminal pads of the electronic device under test.

Specifically, the measurement board has a part of a main body of the apparatus for testing and a plurality of pads on a surface thereof. A structure of a layer of the pad is formed in the same manner as the pad generally used for a well-known print circuit.

As mentioned before, the plate member is arranged on the measurement board and has a plurality of rear pads brought into contact with each of the pads of the measurement board on a rear surface, and a plurality of front pads conducting with each of the rear pads through a via hole on a front surface. The plate member configured in a freely replaceable manner (in other words, the plate member can be readily separated from the measurement board and the device mounting means). In this case, the via holes formed between the front pad with the rear pad may be placed at every one of a pair of front pad and rear pad. A plurality of the via holes may be formed between a pair of the front and the rear pads. A plate-like portion of the plate member can be comprises of some kinds of synthetic resin films such as a polyimide. However, the plate member is preferably constructed by glass epoxy resin when easiness of manual handling is considered. Such glass epoxy resin is also favorable in view of the fact that a glass transition temperature is high (for example, 180° C. or more) so as to withstand a high temperature test (for example, a test under about 85° C.), that a dielectric constant is low (for example, 3.8 or lower), that thermoelasticity is large, that bondability with a Cu foil is good, and that processing is easy.

Further, the front pad and the rear pad of the plate member can be made of a layered structure of Cu/Ni/Pa and Cu/Ni/Au/Rh, and is preferably made of a layered structure of Cu/Ni/Au in view of a cost, stability of finish, and controllability of a plating thickness. In this case, a hardness can be increased by adding Co (for example, about 0.2%) to the Au.

A size of the rear pad and the front pad of the plate member may be identical with each other or different from each other. A hardness of the front pad and the rear pad may be set to be the same as that of a pad generally used (for example, a pad formed on the surface of the measurement board) or lower than the same.

There is a case that the rear pad mentioned above is collapsed and expanded by being brought into pressure contact with the pad formed on the measurement board. In this case, a width of the rear pad may be set to be narrower than a width of the pad formed on the measurement board and a width of the front pad may be set to be equal to the width of the pad formed on the measurement board. In this case, the width of the front pad may be set to be smaller than the width of the pad formed on the measurement pad in the same manner as that of the rear pad.

On the surface of the rear pad of the plate member, in order to improve contact, a projection or a fine undulation may be formed by matte finish. The projection mentioned above can be easily formed by using a well-known photo etching technique, and the fine undulation mentioned above can be easily formed by using a well-known electrolytic plating technique (for example, by adjusting a conducting period for a current). The front pad and the rear pad mentioned above are provided so as to obtain conduct with a contact element mentioned below and, provided in the device mounting means and conduct with the pad formed on the measurement board. However, a layer structure similar to the front pad and the rear pad mentioned above may be formed at a suitable portion of the plate member (for example, at least a periphery of holes for inserting screws and/or pins for positioning and fixing the measurement board, the plate member and the device mounting means) for the purpose of adjusting a height.

Further, the structure may be made such that the device mounting means has a contact element provided so as to extend through the front and rear surfaces, a part of the contact element is provided so as to project to the front and rear surfaces, the front pad of the plate member is brought into wiping contact with the protrusion of the back surface in the contact element, and the terminal pad of the electronic device under test is brought into wiping contact with the protrusion of the front surface in the contact element. The contact element may be a metal. contact. In this case, the metal piece may be constructed by a fine flat plate formed in an S-shaped side elevational shape and two rubber bands provided in upper and lower two steps of the device mounting means are inserted to both S-shaped recess portions, thereby standing the fine flat plates in such a manner as to be mutually in parallel to each other. A material having a hardness higher than the front pad of the plate member (for example, Be-Cu) may be used for the metal piece.

Further, in accordance with another embodiment of the contact element, the contact element can be constructed by an anisotropically conducting sheet structured such that only a compressed portion is electrically conducted in a vertical direction by being compressed (for example, such contact element may be an insulating synthetic resin elastomeric sheet including a conducting fiber in a direction perpendicular to a surface or an oblique direction).

The electronic device to be tested is typically an IC device in which a semiconductor integrated circuit, such as a high frequency IC (for example, an IC operating under a frequency equal to or more than GHz order) is sealed into a package. The IC device may be a SIP (a single inline package), a DIP (a double inline package), a QFP (a quad flat package), a BGA (a ball grid array package) and a PGA (a pin grid array package). A structure of the device mounting means, a structure of the plate member (a size and a pitch of the front pad and the rear pad), and a structure of the measurement board (a size and a pitch of the chip formed on the surface) are different in accordance with a type of the IC device.

Generally, in the case that the IC device is the SIP, DIP and QFP, a contact constructed by a fine flat plate can be used as the contact element, and in the case that the IC device is the BGA and PGA, an anisotropically conducting sheet can be used as the contact element.

In the case that the contact element provided in the device mounting means comprises of the contact with the fine flat plate, generally, a pitch of the contact (the same pitch as the electronic device under test such as the IC device) is the same pitch as the pitch of the front pad of the plate member. Further, the structure may be made such that the pitch of the front pad of the plate member is different from the pitch of the rear pad (for example, the rear pad has a mutual interval greater than that of the front pad), however, it is advantageous for a manufacturing engineering to set the pitch of the front pad of the plate member the same as that of the rear pad. In this case, it is preferable to arrange the front pad and the rear pad of the plate member so as to align with each other and correspond to each other.

Here, conventionally, a contact pin in which a multiplicity of conducting wire materials are wound around an insulating material has been known (for example, refer to Japanese Unexamined Patent Publication (JP-A) No. 134565 of 1993). This kind of contact pin may be used for the contact element of the device mounting means in accordance with the invention.

DESCRIPTION OF THE PREFERRED EMBODIMENT

Figure 1:
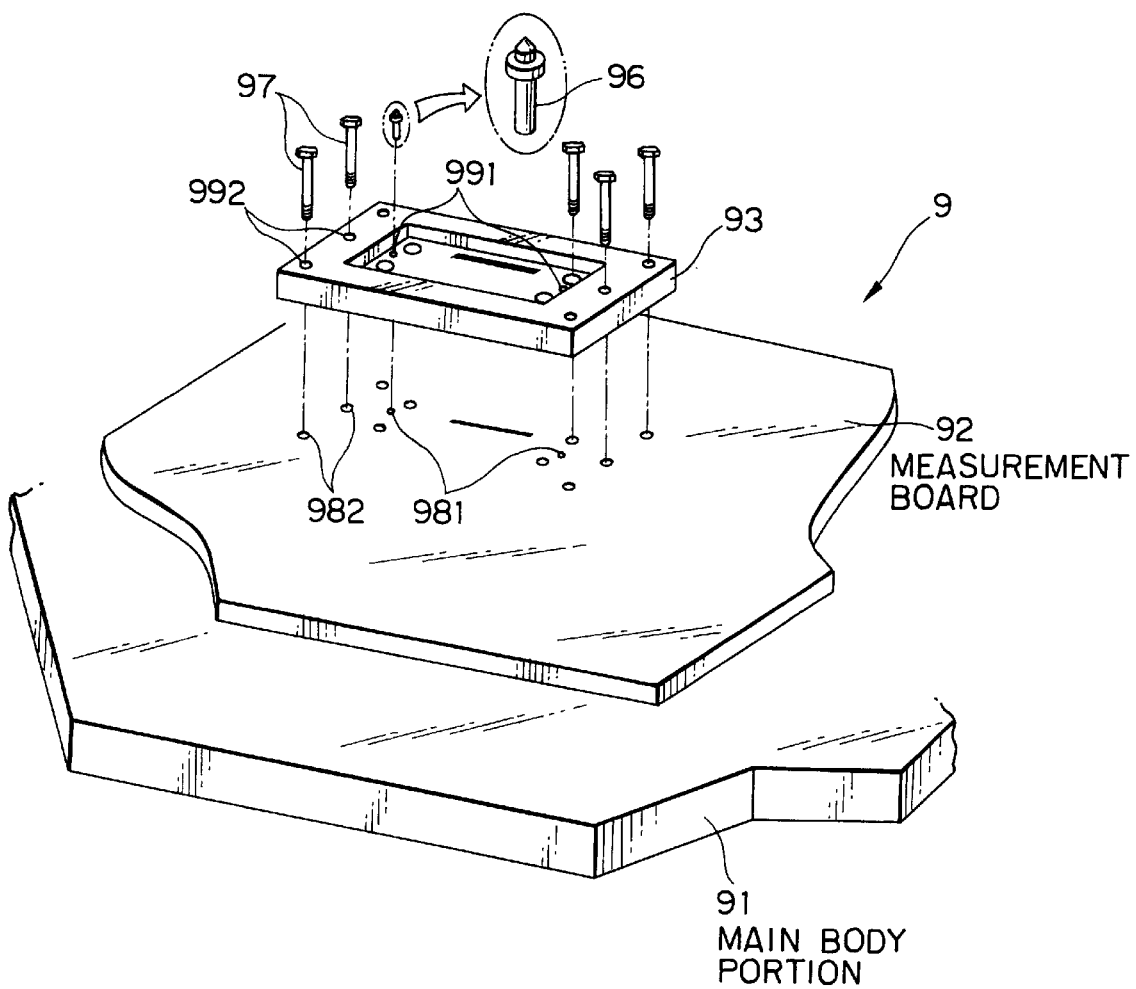
FIG. 1 is a perspective view of a conventional apparatus for testing an electronic device.
Figure 2:
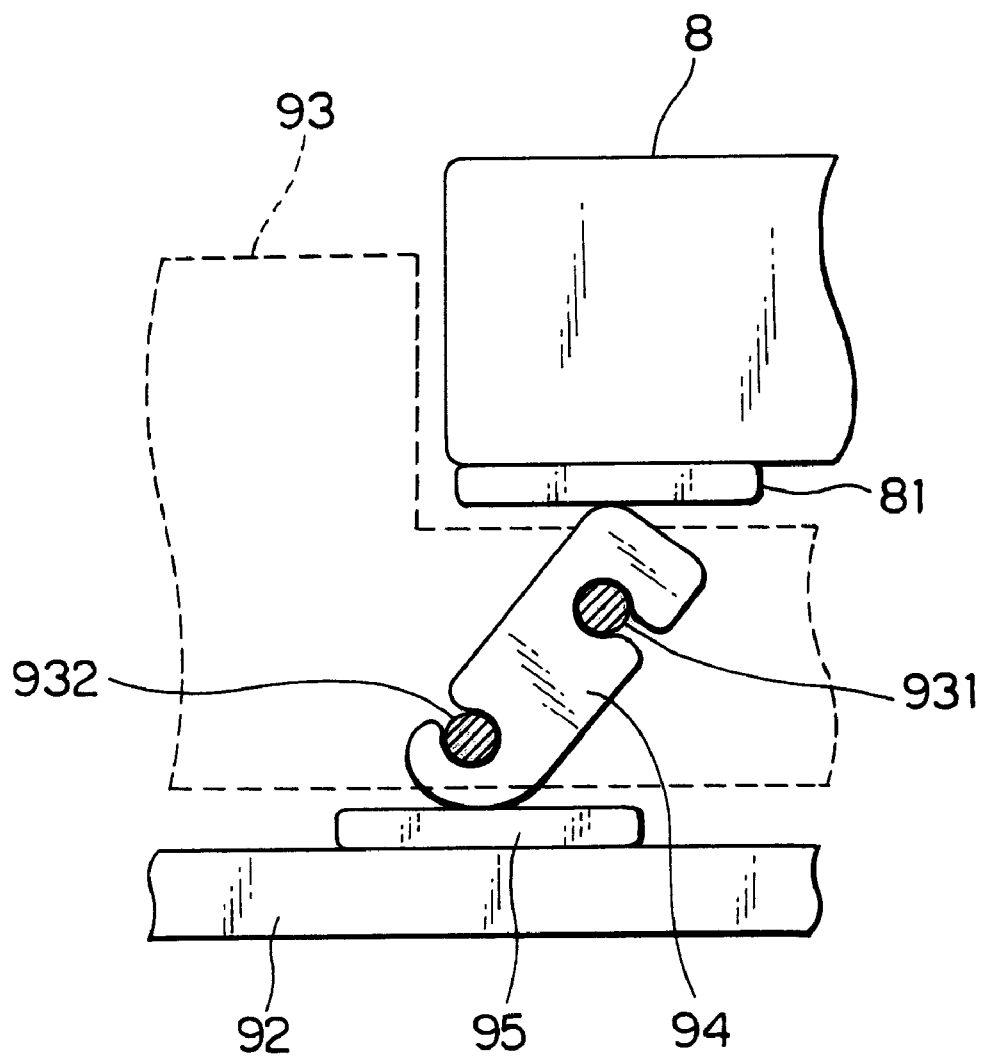
FIG. 2 is a front elevational view of device mounting means in the conventional apparatus for testing the electronic device.

Referring to FIGS. 1 and 2, description will be made about a conventional apparatus for testing an electronic device, such as an IC device, (not shown in FIG. 1) in order to facilitate an understanding of this invention. As shown in FIG. 1, the apparatus is constructed by a main body portion 91, a measurement board 92 provided thereon, and a device mounting member or means 93 attached to the measurement board 92. In FIG. 1, holes 981 for pins and holes 982 for screws are formed on the measurement board 92, and holes 991 for pins and holes 992 for screws are formed on the device mounting means 93. The device mounting means 93 is positioned by positioning pins 96 inserted to the holes 981 and 991 for the pins, and is fixed to the measurement board 92 by screws 97 which are inserted to the holes 982 and 992 for the screws and which are engaged to nuts (nuts which engage to screws 97 are omitted from FIG. 1).

The device mounting means 93 has a contact mechanism which is shown in an enlarged manner, as exemplified in FIG. 2 and which is arranged within a recessed portion of the device mounting means 93. In the illustrated contact mechanism, two rubber bands 931 and 932 are extended in parallel to each other and mechanically coupled to an S-shaped thin contact 94. Although a single contact 94 alone is illustrated in FIG. 2, a plurality of contacts 94 are practically arranged in parallel with one another and mechanically coupled to the rubber bands 931 and 932.

Specifically, each S-shaped thin contact 94 has hook or recessed portions on both ends, as shown in FIG. 2. An upper portion of the contact 94 is brought into contact with a terminal pad 81 of the IC device 8 and a lower portion of the contact 94 is brought into contact with a pad 95 of the measurement board 92.

As readily understood from FIG. 2, the contact 94 rotationally moves when it is pressed and contacted by means of the terminal pad 81 of the IC device 8. Thus, the upper portion of the contact 94 is brought into contact with the terminal pad 81 of the IC device 8 with the terminal pad 81 wiped or scratched with the contact. Therefore, such a contact will be referred to as a wiping and/or a scratch contact hereinafter. Likewise, the lower portion of the contact 94 and the pad 95 of the measurement board 92 are brought into contact with each other to form the wiping contact.

However, in the testing apparatus in FIG. 1, the pad 95 of the measurement board 92 is inevitably wiped or scratched by the contact 94 of the device mounting means 93 at every time when the IC device 8 is attached and detached, as mentioned above. Accordingly, the pad 95 is gradually scraped off or worn away at every time of the attachment and detachment mentioned above.

This means that the measurement board 92 should be finally replaced by a new one when the pad 95 of the measurement board 92 is worn by repetitive wiping of the contacts while the IC devices are mounted on the device mounting means 93 one after another. Since the measurement board 92 is generally expensive, there is a problem that a cost for testing each IC device 8 is objectionably increased. In addition, another problem is to frequently replace the measurement board 92.

Referring to an apparatus according to a first preferred embodiment of the invention will be described in detail below.

Figure 3:
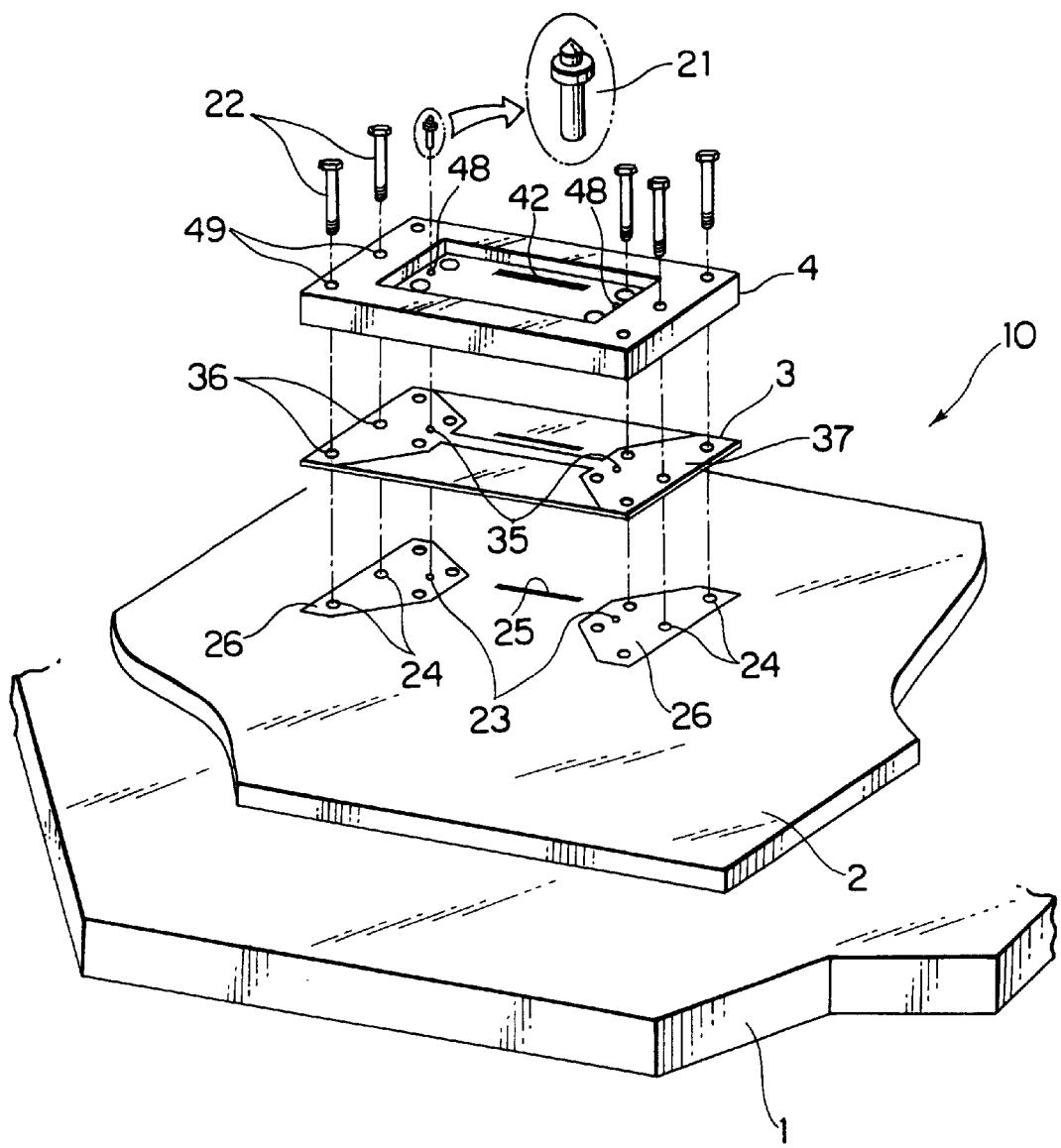
FIG. 3 is an exploded perspective view of an apparatus for testing an electronic device according to a first embodiment of the invention.

FIG. 3 is an exploded perspective view which shows apparatus for testing an (IC Integrated Circuit) of an SIP (Single In-line Package) type. In FIG. 3, a measurement board 2 is mounted on an upper surface of a main body 1 of an apparatus 10 for testing, and a device mounting means 4 having a device mounting portion 47 (refer to FIGS. 6 and 7) is provided above the measurement board 2 through a plate member 3. The plate member 3 and the device mounting means 4 are formed such that a contour in a plan view thereof is substantially the same.

The plate member 3 and the device mounting means 4 are positioned and fixed at a predetermined position of the measurement board 2 by using pins 21 for positioning and screws 22 for mounting (in FIG. 3, an illustration of nuts engaged with the screws 22 is omitted). In this case, holes 23 for pins and holes 24 for screws to which the pins 21 and the screws 22 are respectively inserted are formed on the measurement board 2, holes 35 for pins and holes 36 for screws are similarly formed on the plate member 3, and holes 48 for pins and holes 49 for screws are similarly formed in the device mounting means 4.

Figure 4:
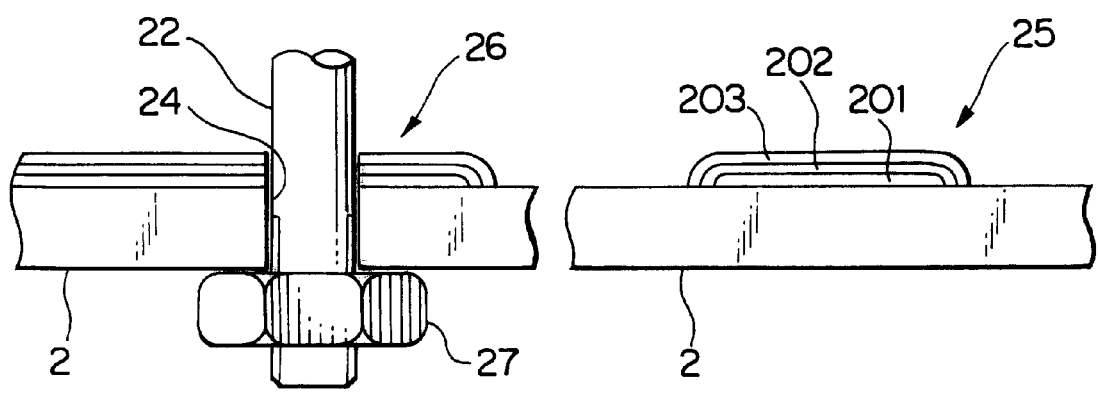
FIG. 4 is a cross sectional view of a measurement board in the apparatus for testing the electronic device according to the first embodiment of the invention.

FIG. 4 is a cross sectional view which shows a portion of the measurement board 2 near the pad 25 and the hole 24 for the screw formed. In this case, also shown is a state in which the screw 22 is inserted to the hole 24 for the screw and a nut 27 is mounted to a distal end of the screw 22. In FIG. 4, the pad 25 is formed by laminating successively a Ni layer 202 and an Au layer 20 on a Cu foil 201. An approximate size of the pad 25 is constructed such that a thickness is about 80 $\mu$m, a width is about 0.5 mm and a length is about 2 mm. In accordance with the this embodiment, the pad 25 is formed so as to have the same pitch (here, 0.65 mm) as that of a contact 45 mentioned below and provided in the device mounting means 4. Further, a metal layer 26 having the same structure as that of the pad 25 is formed on the measurement board 2 and near the hole 24 for the screw. In this case, an illustration is omitted, however, the metal layer 26 having the similar structure to that mentioned above is formed in a portion of the measurement board 2 on which the hole 23 for the pin is formed. The metal layers 26 are illustrated in FIG. 3.

Figure 5A:
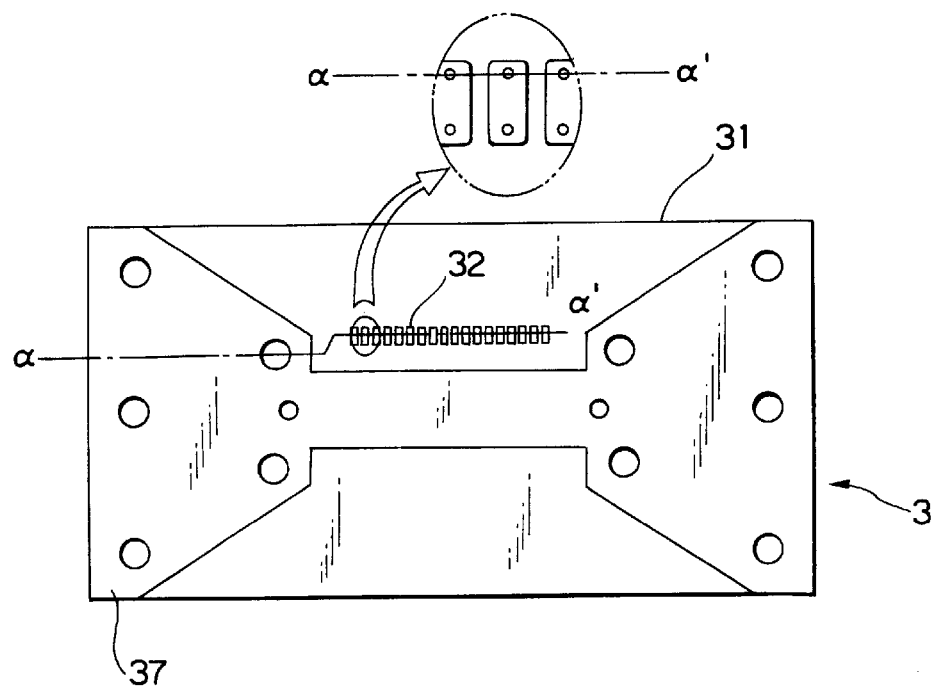
FIG. 5A is a plan view of a plate member in the apparatus for testing the electronic device according to the first embodiment of the invention.

FIG. 5A is a drawing which shows the plate member 3 as seen from a side of a surface (the surface confronting the device mounting means 4). Here, a front pad 32 and a rear pad 33 are formed on front and rear surfaces of a plate-part 31 of the plate member 3 respectively at the same pitch (0.65 mm) as that of the pad 25 mentioned above (in FIG. 5A, the rear surface is not shown, so that the rear pad 33 is not illustrated).

Figure 5B:
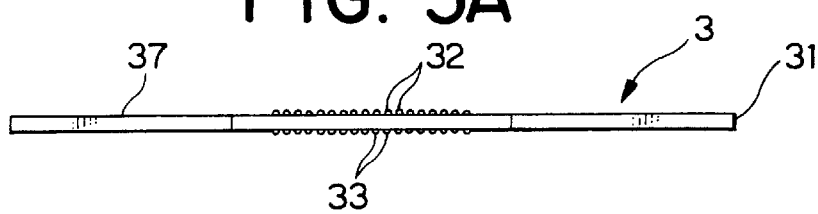
FIG. 5B is a side elevational view of the plate member in the apparatus for testing the electronic device according to the first embodiment of the invention.
Figure 5C:
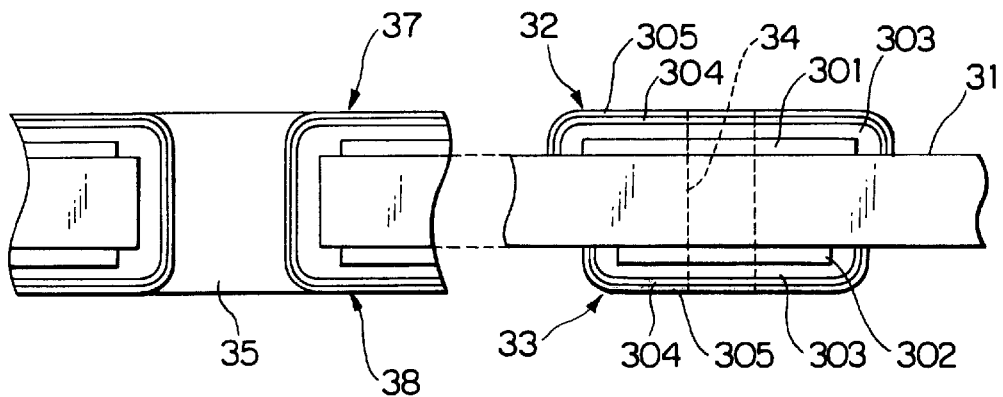
FIG. 5C is a partly enlarged cross sectional view of a front pad and a rear pad in the apparatus for testing the electronic device according to the first embodiment of the invention.

FIG. 5B is a side elevational view of the plate member 3 and FIG. 5C is a partly enlarged view which shows a cross section along a line of $\alpha$–$\alpha'$ of FIG. 5A of the front pad 32 and the rear pad 33. As shown in FIG. 5C, the front pad 32 and the rear pad 33 are electrically conducted through a via hole 34 mentioned below. Here, in the preferred embodiment, the plate-part 31 is constructed by glass epoxy resin sheet having a thickness of 0.3 mm.

The front pad 32 and the rear pad 33 are constructed by forming the via hole 34 after laminating a Cu layer 30 on each of the Cu foil layers 301 and 302 formed on the front and rear surfaces of the plate-part 31 by an electrolytic plating, and further laminating a Ni layer 304 and an Au layer 305 containing 0.2% Co by an electrolytic plating. Here, it is set in thickness such that the Cu foil layers 301 and 302 are 35 $\mu$m, the Cu layer 303 is 35 $\mu$m, the Ni layer 304 is 7 $\mu$m and the Au layer 305 is 0.7 $\mu$m. Further, a width of the front pad 32 is formed to be 0.5 mm the same as the width of the pad 25 formed on the measurement board 2, and a width of the rear pad 33 is formed to be 0.48 mm which is 10 $\mu$m narrower in both sides than the width of the Cu foil layer 301 on the front surface.

Here, in the preferred embodiment, the heights of the different portions of the measurement board 2 from the height of the device mounting means 4 are adjusted to the same. To this end, a front metal layer 37 and a rear metal layer 38 which have the same structure as that of the front pad 32 and the rear pad 33 are formed on the front and rear surfaces respectively around the hole 35 for the pin, as shown in FIG. 5C. Although illustration is omitted, a metal layer having the same structure as that mentioned above is formed in a periphery of the hole 36 for the pin mentioned above. The front metal layer 37 is illustrated in FIG. 3.

Figure 6:
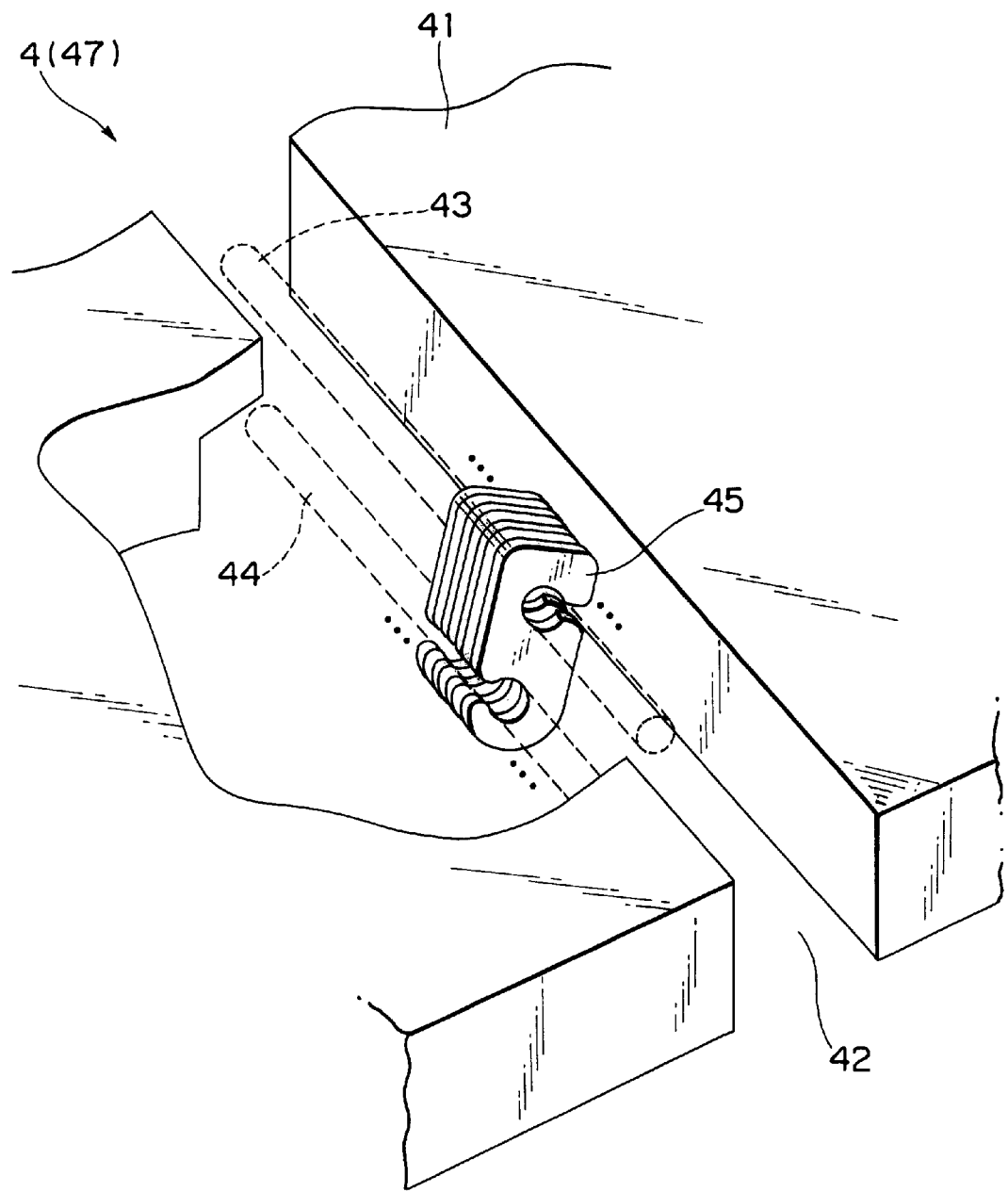
FIG. 6 is a partly perspective view of device mounting means in the apparatus for testing the electronic device according to the first embodiment of the invention.

FIG. 6 is a partly cut-away sectional view which shows a contact mechanism of the device mounting means 4. As shown in FIG. 6, a slit 42 having a thickness of 5.59 is formed in a bottom portion 41 of a device mounting part 47, and rubber bands 43 and 44 are mounted within the slit respectively on upper and lower stages. The rubber bands 43 and 44 are inserted to both S-shaped recess portions of each contact 45 formed in an S-shaped side elevational shape. Here, each contact 45 is formed by a fine flat plate (made of Be—Cu (Beryllium Copper) having a hardness higher than that of the front pad 32 of the plate member 3) having a thickness of about 300 μm and a length of about 4 mm. The contacts 45 are provided in a upright position at the same pitch (in this case, 0.65 mm) so as to be mutually parallel to each other, and upper and lower ends thereof can protrude respectively from upper and lower surfaces of the bottom portion 41 of the device mounting portion 47. Here, the device mounting means 4 is conventionally well-known, and is commercially available on market, for example, as "Johnstech Short Contact™" from JOHNSTECH INTERNATIONAL CO., LTD.

Figure 7:
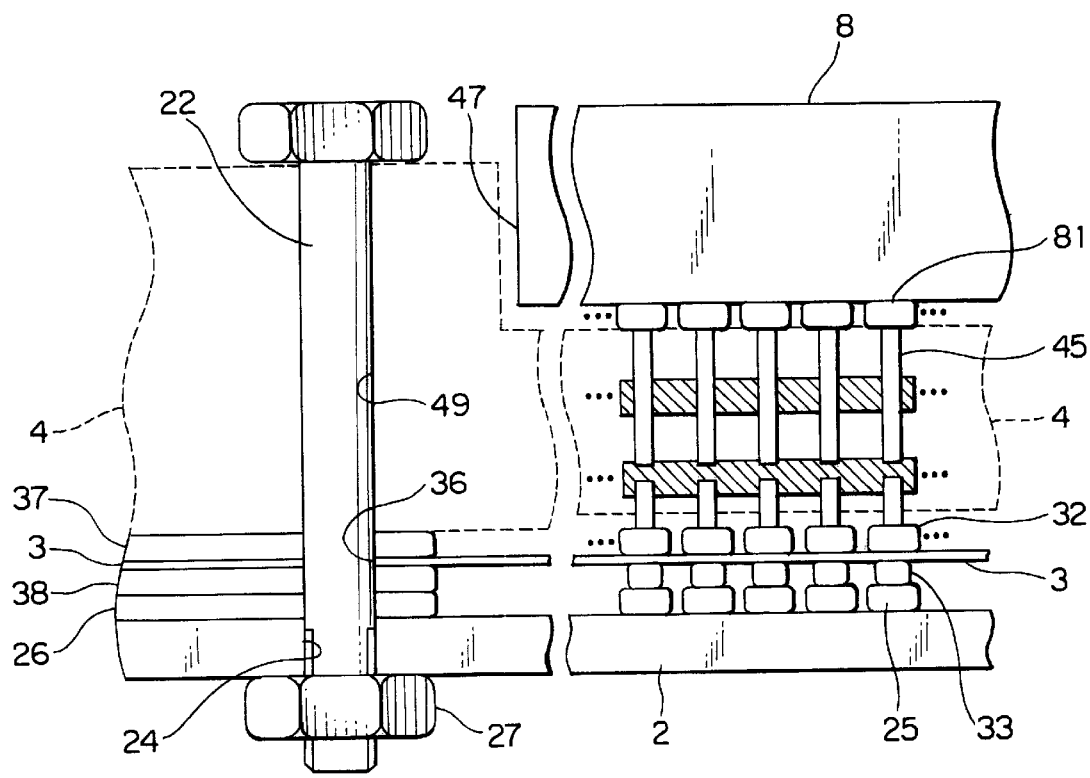
FIG. 7 is a cross section al view showing a state that the device mounting means is mounted to the measurement board through the plate member in the apparatus for testing the electronic device according to the first embodiment of the invention.

FIG. 7 shows the measurement board 2 and device mounting means 4 mounted on the measurement board 2 through the plate member 3, and shows each portion near each of the holes 24, 36 and 49 for the screws and a portion near the pads 25, 32 and 33 in an enlarged size. Here, in FIG. 7, the IC device 8 mounted to the device mounting portion 47 is also illustrated. In the FIG. 7 shown is that a terminal pad 81 of the IC device 8 is brought into pressure contact with the contact 45.

The apparatus according to this embodiment can be constructed by using the same elements as those of the conventional apparatus, except the plate member 3. Since the nut 27 can be mated to the screw 22 so that the maximum thickness of the plate member 3 can be absorbed. Accordingly, the apparatus according to this embodiment can use the main body 1, the measurement board 2, and the device mounting means 4 which are all illustrated in FIG. 1.

As is apparent from FIG. 7, the rear metal layer 38 is formed near the screw 22 on the rear surface of the plate member 3 (and near the hole 35 for the pin which is not illustrated) as mentioned above. Further, the metal layer 26 is formed in the hole 24 for the screw of the measurement board 2 (and near the hole 23 for the pin which is not illustrated). Accordingly, the plate member 3 may not be bent in a convex manner.

Further, in the preferred embodiment, the rear pad 33 of the plate member 3 is set such that the thickness thereof is thicker than the chip used for the normal printed circuit board. Accordingly, there can be a case that the rear pad 33 is collapsed due to the pressing force. However, as shown in FIGS. 5C and 7, since the rear pad 33 is set such that the width thereof is narrower than the pad 25 of the measurement board 2, the rear pad 33 is not brought into contact with the other adjacent rear pad 33 or the pad 25 of the measurement board 2 brought into pressure contact with the other rear pad 33, even if the collapsing occurs.

Generally, the device mounting means 4 is designed by taking into consideration a distance between the device mounting means 4 and the pad positioned below. Accordingly, when the distance between the device mounting means 4 and the front pad 32 of the plate member 3 is shorter, the pressing force between the contact and the pad positioned below becomes too high, so that it is possible that the pad is largely scraped out by the contact 45. In the preferred embodiment, since the front metal layer 37 is formed, near the hole 35 for the pin and the hole 36 for the screw, on the front surface of the plate member 3 as already shown in FIG. 7, the disadvantage mentioned above does not occur even when the device mounting means 4 used for the conventional apparatus for testing is used as it is. In the illustrated embodiment, when the attachment and detachment of the IC device 8 are repeated a predetermined number of times (for example, some hundred thousands), the existing plate member 3 is scrapped and is replaced by a new one. Since a manufacturing cost of the plate member 3 is significantly lower (for example, about 1/30) than a manufacturing cost of the measurement board 2, a cost for testing an electronic device can be significantly reduced. A replacement of the plate member 3 can be performed together with a cleaning of the surface of the measurement board 2 (for removing operation of metal powder).

Figure 8:
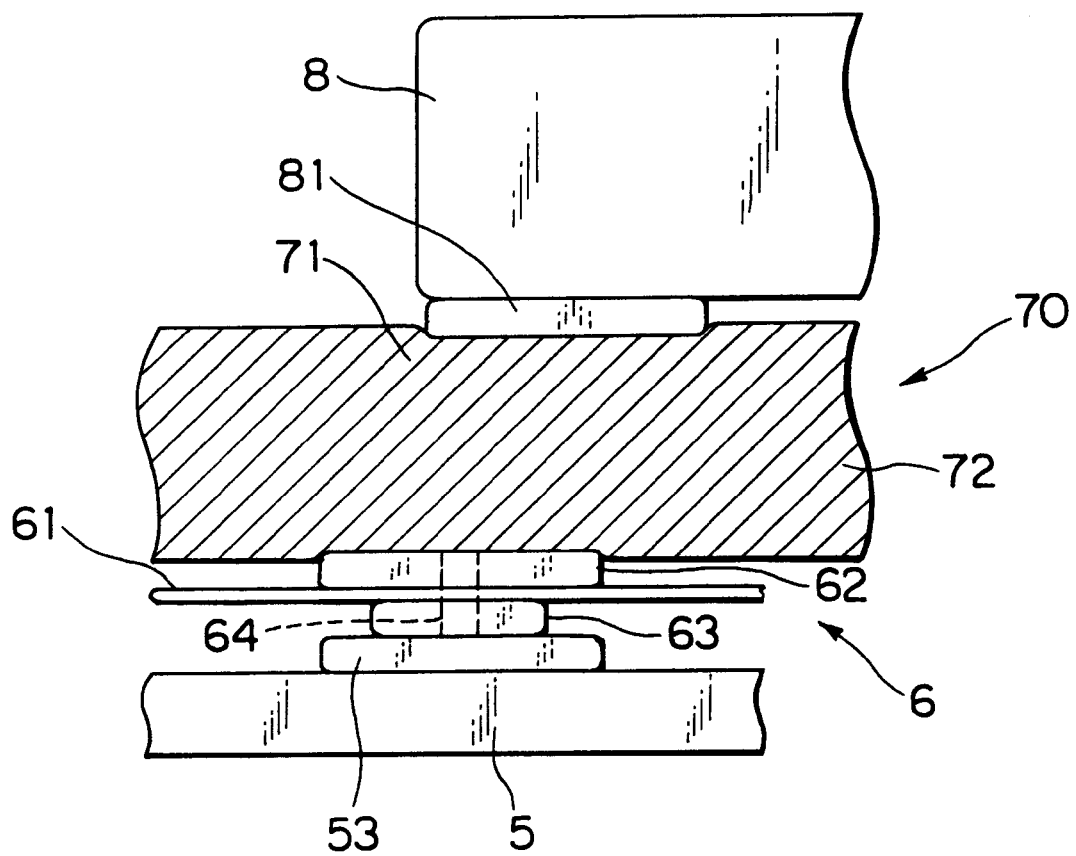
FIG. 8 is a cross sectional view showing a state that the device mounting means is mounted to the measurement board through the plate member in an apparatus for testing an electronic device according to a second embodiment of the invention.

FIG. 8 is a drawing which shows a second preferred embodiment of the invention in which an anisotropically conducting sheet is used as the device mounting means. In FIG. 8, an apparatus for testing an electronic device is constructed as comprising a measurement board 5, a plate member 6 and electronic device mounting means. The structure of the measurement board 5 is substantially the same as that of the measurement board 2 described in FIG. 4, and it is shown in FIG. 8 that a pad 53 is formed thereon is shown. Further, the structure of the plate member 6 is substantially the same as that of the plate member 3 described in FIGS. 5A to 5C, and it is shown in FIG. 8 that a front pad 62 and a rear pad 63 are formed respectively on front and rear surfaces of a plate-part 61 through a via hole 64. In FIG. 8, the device mounting means has an anisotropically conducting sheet 70 as below described. The anisotropically conducting sheet 70 is made of an elastomeric synthetic resin 72, and a multiplicity of Au threads 71 are provided therewithin so as to be slightly inclined from a surface orientation.

In the preferred embodiment in FIG. 8, when an electronic device under test (an IC device 8) is set to the device mounting means, the anisotropically conducting sheet 70 is compressed, an upper end of the Au thread 71 is brought into wiping contact with a terminal pad 81 of the IC device 8, and a lower end of the Au thread 71 is brought into wiping contact with a front pad 62 of the plate member 6. Due to the wiping contact, the front pad 62 of the plate member 6 is gradually scraped.

In this case, when a number of the attachment and detachment of the IC device 8 reaches a predetermined number (for example, some hundred thousands), the current plate member 6 is scrapped and replaced by a new one.

As is described in the above paragraphs, according to the present invention a consumption of the measurement board can be saved by the plate member, so that a life of the measurement board can be significantly extended.

What is claimed is:

1. An apparatus for testing an electronic device, for mounting thereon said electronic device under test and for performing an electronic test on said electronic device under test, comprising:

a measurement board forming a part of a main body of a testing apparatus and having a plurality of pads on a surface thereof;

a reusable plate member which is detachable from said measurement board and which has a plurality of rear pads brought into contact with each of said pads of said measurement board on a back surface thereof and a plurality of front pads electrically connected to each of said rear pads through via holes on a front surface thereof; and a device mounting member having a front surface, a rear surface, a contact element extending from the front surface to the rear surface of the device mounting member, with the contact element partially protruded from the front and rear surfaces, said device mounting member being constructed such that said front pads of said plate member is brought into wiping contact with said rear surface in said contact element while a terminal pad of said electronic device under test is brought into wiping contact with said front surface in said contact element.

2. An apparatus for testing an electronic device as claimed in claim 1, wherein said contact element comprises an anisotropically conducting sheet.

3. An apparatus for testing an electronic device as claimed in claim 1, wherein said front pad and said rear pad of said plate member have the same pitch.

4. An apparatus for testing an electronic device as claimed in claim 1, wherein a width of said rear pad of said plate member is narrower than a width of said pad of said measurement board.

5. An apparatus for testing an electronic device as claimed in claim 1, wherein a hardness of said rear pad of said plate member is lower than the hardness of said chip of said measurement board.

6. An apparatus for testing an electronic device as claimed in claim 1, wherein a projection or a fine undulation is formed on the surface of said rear pad of said plate member.

7. An apparatus for testing an electronic device as claimed in claim 1, wherein said electronic device under test is a semiconductor memory, a contact of said device mounting means and said pad of said measurement board are formed at the same pitch as that of a terminal pad of said semiconductor memory.

8. An apparatus for testing an electronic device as claimed in claim 1, wherein a plate-part of said plate member is constructed by a glass epoxy resin having a glass-transition temperature of 180 degrees or more centigrade and a dielectric constant of 3.8 or less, and said front pads and said rear pads of said plate member are constructed by a layered structure in which a Cu, a Ni and an Au are plated on a Cu foil.

9. An apparatus for testing an electronic device as claimed in claim 1, wherein said device mounting means and said plate member are integrally mounted to said measurement board.

10. An apparatus for testing an electronic device as claimed in claim 1, in which said measurement board, said plate member and said device mounting means are positioned by screws and/or pins so as to be integrally formed, wherein a metal layer having the same thickness and the same structure as those of said rear pads and said front pads is formed at least in a periphery of holes for inserting said screws and/or for said pins of said plate member.

11. An apparatus for testing an electronic device as claimed in claim 1, wherein said contact element is constructed by a plurality of contacts.

12. An apparatus for testing an electronic device as claimed in claim 11, wherein each of said contacts is constructed by a fine flat plate formed in an S-shaped side elevational shape, and said fine flat plate is constructed such that both recess portions of said S-shaped portion is inserted to two rubber bands provided in said device mounting means in upper and lower two steps so as to mutually stand in parallel to each other.

* * * * *

UNITED STATES PATENT AND TRADEMARK OFFICE
CERTIFICATE OF CORRECTION

PATENT NO. : 6,154,040
DATED : November 28, 2000
INVENTOR(S) : Teruaki TSUKAMOTO, Minoru DOI It is certified that error appears in the above-identified patent and that said Letters Patent is hereby corrected as shown below:

Column 6, line 5, delete "layer 20" insert --layer 203-- line 36, delete "layer 30" insert --layer 303--.

Signed and Sealed this

Twenty-ninth Day of May, 2001

*Attest:*

NICHOLAS P. GODICI

*Attesting Officer*    *Acting Director of the United States Patent and Trademark Office*